United States Patent [19]
Farnworth et al.

[11] Patent Number: 5,691,649
[45] Date of Patent: Nov. 25, 1997

[54] CARRIER HAVING SLIDE CONNECTORS FOR TESTING UNPACKAGED SEMICONDUCTOR DICE

[75] Inventors: Warren M. Farnworth, Nampa; Salman Akram, Boise; Mike Brooks, Caldwell, all of Id.

[73] Assignee: Micron Technology, Inc., Boise, Id.

[21] Appl. No.: 587,175

[22] Filed: Jan. 16, 1996

Related U.S. Application Data

[63] Continuation-in-part of Ser. No. 398,309, Mar. 1, 1995, Pat. No. 5,519,332, which is a continuation-in-part of Ser. No. 345,064, Nov. 14, 1994, Pat. No. 5,541,525, which is a continuation-in-part of Ser. No. 124,899, Sep. 21, 1993, Pat. No. 5,495,179, which is a continuation-in-part of Ser. No. 46,675, Apr. 14, 1993, Pat. No. 5,367,253, which is a continuation-in-part of Ser. No. 973,931, Nov. 10, 1992, Pat. No. 5,302,891, which is a continuation of Ser. No. 709,858, Jun. 4, 1991, abandoned.

[51] Int. Cl.$^6$ ................................. G01R 31/02
[52] U.S. Cl. ................................. 324/755; 439/68
[58] Field of Search ................................. 324/755, 754; 439/68, 71, 73

[56] References Cited

U.S. PATENT DOCUMENTS

| | | | |
|---|---|---|---|
| 4,169,642 | 10/1979 | Mouissie | 439/68 |
| 4,783,719 | 11/1988 | Jamison et al. | 439/68 |
| 4,846,703 | 7/1989 | Matsuoka et al. | 439/73 |
| 4,846,704 | 7/1989 | Ikeya | 439/73 |
| 4,899,921 | 2/1990 | Bendat et al. | 228/105 |
| 4,918,513 | 4/1990 | Kurose et al. | 439/73 |
| 4,969,828 | 11/1990 | Bright et al. | 439/68 |
| 5,006,792 | 4/1991 | Malhi et al. | 324/158 F |
| 5,073,117 | 12/1991 | Malhi et al. | 439/71 |
| 5,088,190 | 2/1992 | Malhi et al. | 28/843 |
| 5,123,850 | 6/1992 | Elder et al. | 439/67 |
| 5,302,891 | 4/1994 | Wood et al. | 324/158 F |
| 5,367,253 | 11/1994 | Wood et al. | 324/158.1 |
| 5,397,245 | 3/1995 | Roebuck et al. | 439/263 |
| 5,408,190 | 4/1995 | Wood et al. | 324/765 |
| 5,419,807 | 5/1995 | Akram et al. | 156/647.1 |
| 5,451,165 | 9/1995 | Cearley-Cabbiness et al. | 439/71 |
| 5,456,404 | 10/1995 | Robinette, Jr. et al. | 228/102 |

*Primary Examiner*—Ernest F. Karlsen
*Attorney, Agent, or Firm*—Stephen A. Gratton

[57] ABSTRACT

A carrier for testing an unpackaged semiconductor die is provided. The carrier comprises a base for holding the die, an interconnect for establishing a temporary electrical connection with the die, and a force applying mechanism for biasing the die and interconnect together. The base includes external contacts arranged as flat metal pads in a dense grid array and electrically connected to a pattern of contact pads. The carrier also includes a pair of slide connector members which provide an electrical path between the contact pads on the base and corresponding contact pads on the interconnect. The slide connector members can be formed of molded plastic or ceramic and include tine contacts that slidably engage the contact pads on the interconnect and base. The slide connector members permit the interconnect to be easily replaced for testing of different types of dice.

14 Claims, 3 Drawing Sheets

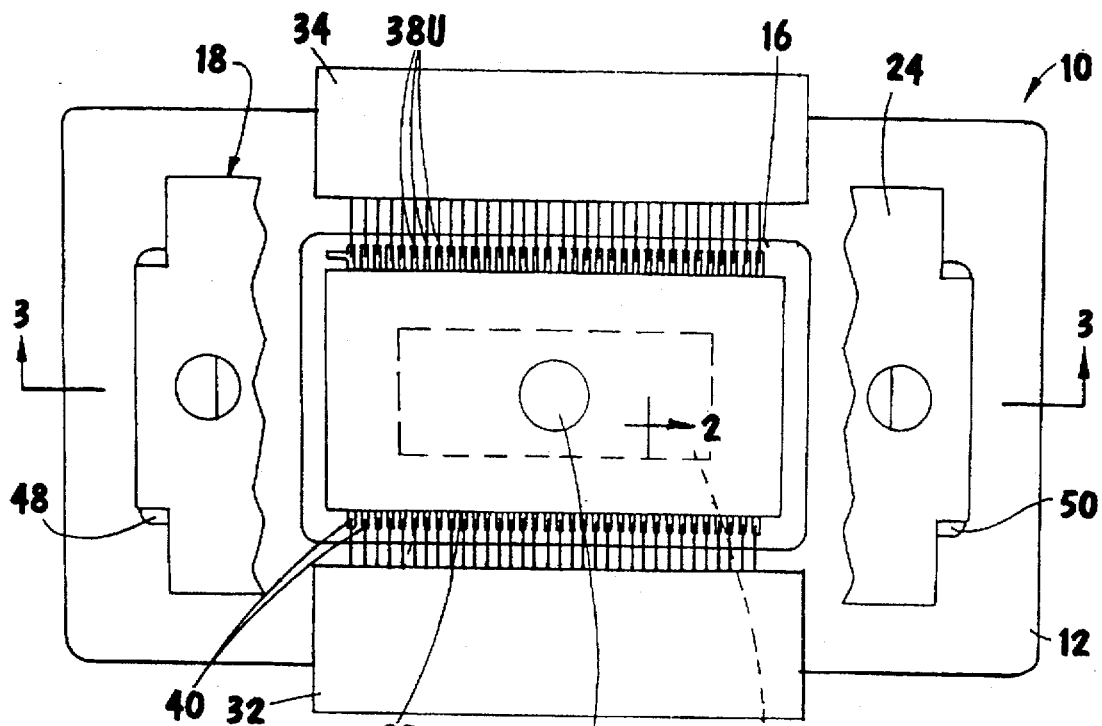
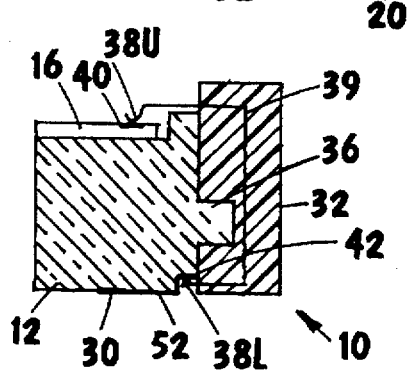
FIGURE 2
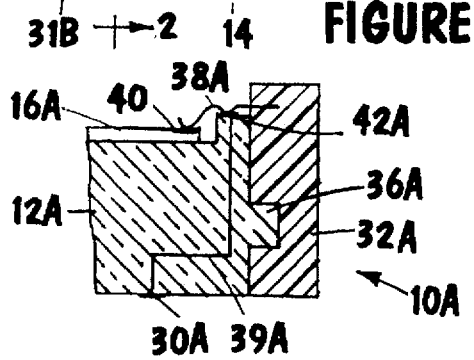
FIGURE 2A
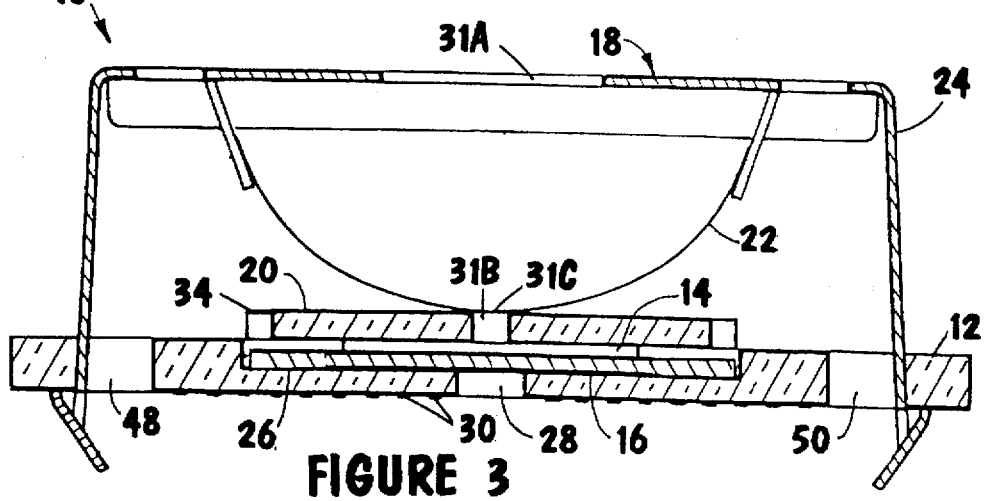
FIGURE 3

CARRIER HAVING SLIDE CONNECTORS FOR TESTING UNPACKAGED SEMICONDUCTOR DICE

CROSS REFERENCE TO RELATED APPLICATIONS

This application is a continuation-in-part of application Ser. No. 08/398,309 filed Mar. 1, 1995, U.S. Pat. No. 5,519,332, which is a continuation-in-part of application Ser. No. 08/345,064 filed Nov. 14, 1994, U.S. Pat. No. 5,541,525, which is a continuation-in-part of application Ser. No. 08/124,899 filed Sep. 21, 1993, U.S. Pat. No. 5,495,179, which is a continuation-in-part of application Ser. No. 08/046,675, filed Apr. 14, 1993, U.S. Pat. No. 5,367,253, which is a continuation-in-part of application Ser. No. 07/973,931 filed on Nov. 10, 1992, U.S. Pat. No. 5,302,891, which is a continuation of application Ser. No. 07/709,858, filed Jun. 4, 1991, abandoned.

This application is related to copending applications Ser. No. 07/788,065 filed Nov. 5, 1991 U.S. Pat. No. 5,440,240; Ser. No. 07/953,750 filed Sep. 29, 1992, now abandoned; Ser. No. 08/073,005 filed Jun. 7, 1993 U.S. Pat. No. 5,408,190; Ser. No. 08/073,003 filed Jun. 7, 1993, now abandoned; Ser. No. 08/120,628 filed Sep. 13, 1993, now abandoned; Ser. No. 07/896,297 filed Jun. 10, 1992, U.S. Pat. No. 5,424,652; Ser. No. 08/192,391 filed Feb. 3, 1994 U.S. Pat. No. 5,483,171; and, Ser. No. 08/137,675 filed Oct. 14, 1993, now abandoned.

FIELD OF THE INVENTION

This invention relates generally to semiconductor manufacture and specifically to the testing of semiconductor dice.

BACKGROUND OF THE INVENTION

Unpackaged semiconductor dice are used to construct multi-chip-modules and other electronic devices. Prior to use in an electronic device, an unpackaged die must be individually tested to certify that it is a known good die (KGD). Testing can include burn-in testing and full functionality testing.

For test and burn-in of an unpackaged die, a carrier replaces a conventional single chip package in the manufacturing process as a temporary package. The carrier typically includes an interconnect that allows a temporary electrical connection to be made between external test circuitry and the die.

In response to the need for known good die (KGD), semiconductor manufacturers have developed carriers for testing unpackaged die. As an example, carriers for testing unpackaged die are disclosed in U.S. Pat. No. 4,899,107 to Corbett et al. and U.S. Pat. No. 5,302,891 to Wood et al., which are assigned to Micron Technology, Inc.

With this type of carrier, the interconnect contains the contact structure that physically aligns with and contacts the bond pads of the die. Typically the interconnect is wire bonded to connection points on the carrier which electrically communicate with external contacts, such as pins, formed on the carrier. The external contacts are connectable to test circuitry through a mating element such as a socket on a burn-in board.

Because semiconductor dice are manufactured in different sizes and bond pad configurations (e.g., edge connect, end connect, LOC) it is often necessary to replace an interconnect to allow the carrier to accommodate testing of different types of dice. It would also be advantageous to provide a method other than wire bonding for establishing an electrical connection between the interconnect and carrier.

In view of the foregoing, it is an object of the present invention to provide an improved carrier for testing unpackaged dice. It is yet another object of the present invention to provide an improved carrier for testing unpackaged dice that includes slide connector members that establish electrical communication between external contacts on the carrier and an interconnect for the die. Other objects, advantages and capabilities of the present invention will become more apparent as the description proceeds.

SUMMARY OF THE INVENTION

In accordance with the present invention, a carrier for temporarily packaging and testing a bare semiconductor die is provided. The carrier includes a base for holding the die, an interconnect for establishing electrical communication with the die, and a force applying mechanism for biasing the die and interconnect together. In addition, the carrier includes slide connector members which removably attach to the base and establish electrical communication between the interconnect and external contacts on the base. The slide connector members include tine contacts that slidably engage contact pads on the interconnect and contact pads on the carrier base.

The carrier base can be either ceramic or plastic. The carrier base can be formed of ceramic using a ceramic lamination process or a ceramic dip formation process. Alternately, the carrier base can be formed of plastic using a 3-D injection molding process. The interconnect is mounted to the carrier base and includes contact members that contact device bond pads or other contact locations on the die. The interconnect can be formed of silicon with raised contact members having elongated penetrating projections for penetrating into the bond pads to a limited penetration depth. Alternately, the interconnect can be formed with microbump contact members mounted on a plastic film similar to two layer TAB tape. The force applying mechanism for the carrier can include a pressure plate, a spring and a bridge clamp. The force applying mechanism functions to secure the die within the base and to maintain the die and interconnect in electrical contact.

The carrier is assembled by optically aligning the die and the interconnect. During the alignment procedure, the die and force applying mechanism of the package are held by an assembly tool. Flip chip optical alignment is used to align bond pads or other contact locations on the die to the contact members on the interconnect. The assembly tool then places the die on the interconnect and attaches the force applying mechanism to the carrier base.

BRIEF DESCRIPTION OF THE DRAWINGS

FIG. 1 is a plan view partially cut away of a carrier constructed in accordance with the invention;

FIG. 2 is an enlarged cross sectional view taken along section line 2—2 of FIG. 1 showing a slide connector member attached to a base of the carrier;

FIG. 2A is a cross sectional view equivalent to FIG. 2 of an alternate embodiment slide connector member;

FIG. 3 is a cross sectional view taken along section line 3—3 of FIG. 1;

DETAILED DESCRIPTION OF THE PREFERRED EMBODIMENT

Figure 4:
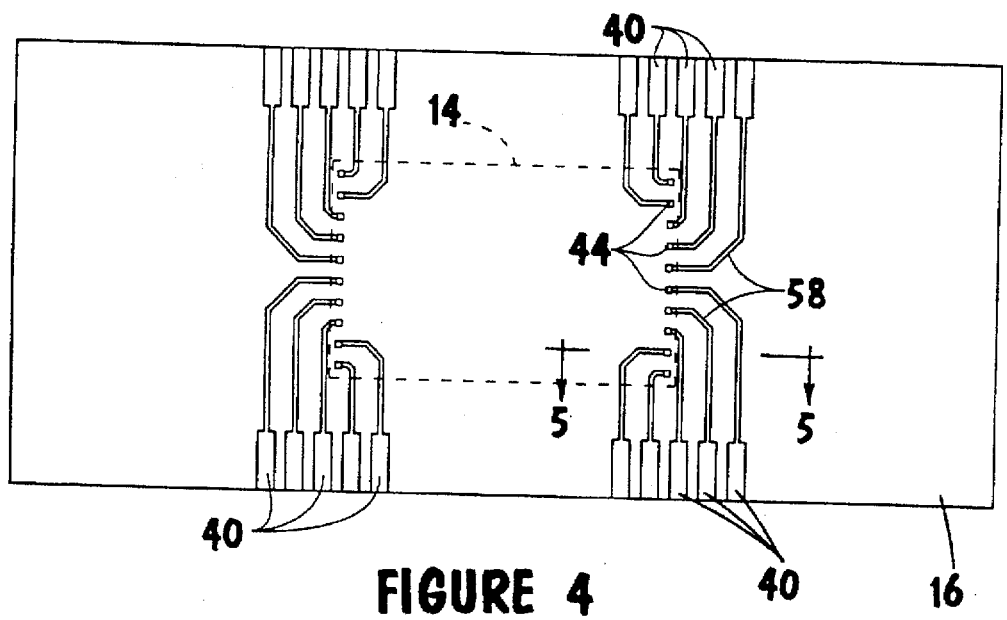
FIG. 4 is a plan view of an interconnect for the carrier shown in FIG. 1.

Referring initially to FIGS. 1–3, a carrier 10 constructed in accordance with the invention is shown. The carrier 10, generally stated, includes: a carrier base 12 adapted to retain a die 14 for testing; a temporary interconnect 16 adapted to establish electrical communication with the die 14; a force applying mechanism 18 comprising a pressure plate 20, a spring 22 (FIG. 3) and a bridge clamp 24 (FIG. 3) for biasing the die 14 against the interconnect 16 with an evenly distributed biasing force; and a pattern of output contacts 30 (FIG. 3) formed on carrier base 12.

Figure 5:
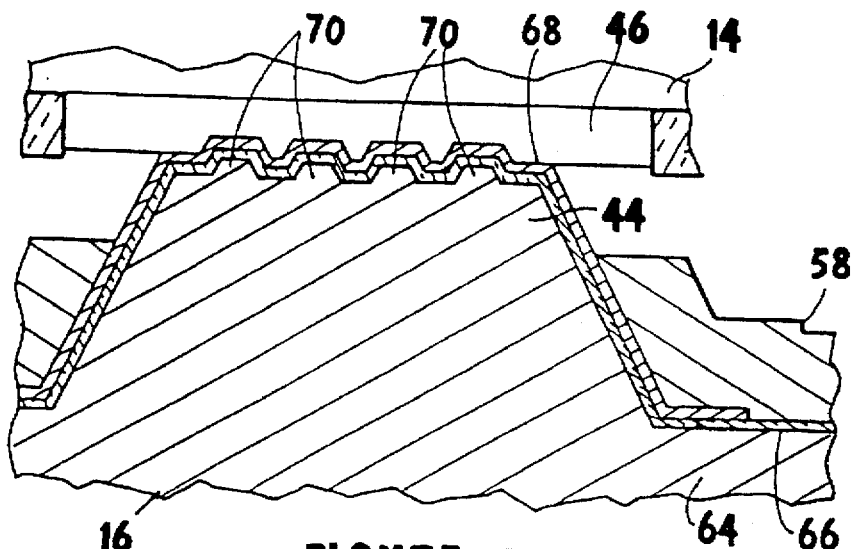
FIG. 5 is an enlarged cross sectional view taken along section line 5—5 of FIG. 4 showing a contact member on the interconnect engaging a device bond pad.
Figure 6:
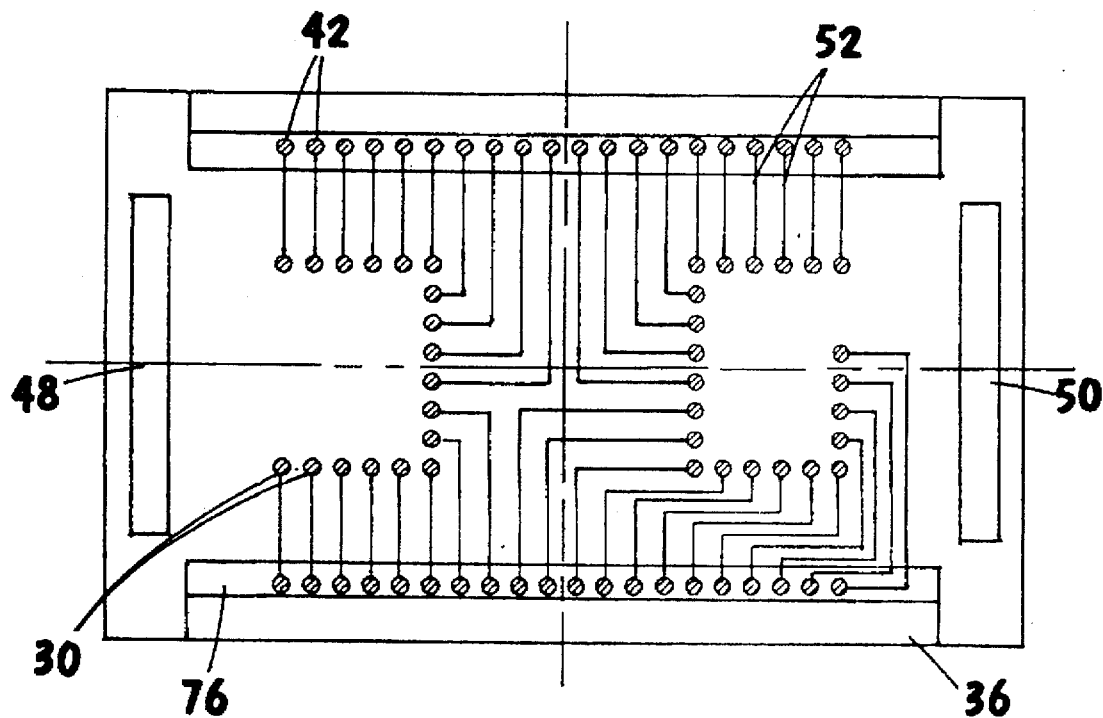
FIG. 6 is a bottom view of the carrier shown in FIG. 1.

The carrier 10 also includes a pair of slide connector members 32, 34 adapted to establish electrical communication between the interconnect 16 and the output contacts 30 on the carrier base 12. As shown in FIG. 2, the slide connector members 32, 34 snap fit onto rails 36 formed on the base 12. As also shown in FIG. 2, the slide connector members 32, 34 include upper tine contacts 38U that contact a pattern of contact pads 40 on the interconnect 16 and lower tine contacts 38L that contact a pattern of contact pads 42 on the carrier base 12. As shown in FIG. 4, the contact pads 40 on the interconnect 16 are in electrical communication with raised contact members 44 (FIG. 5) that penetrate the device bond pads 46 (FIG. 5) on the die 14 to a limited penetration depth. As shown in FIG. 6, the contact pads 42 on the carrier base 12 are in electrical communication with the output contacts 30 via a pattern of conductors 52 formed on the carrier base 12. In addition, the carrier base includes a recessed contact pad shelf 76 wherein the contact pads 42 are formed.

With reference to FIG. 3, in the assembled carrier 10, the interconnect 16 fits in a cavity 26 within the carrier base 12. The carrier base 12 includes an extraction opening 28 to facilitate installation and removal of the interconnect 16. In addition, the carrier base 12 includes a pair of slotted through openings 48, 50 for retaining the force applying mechanism 18. In the assembled carrier 10, the die 14 is placed face down (i.e., bond pad side down) on the interconnect 16. The pressure plate 20, spring 22 and bridge clamp 24 all include a central opening 31A–C which are used during assembly and disassembly of the carrier 10. Specifically, the openings 31A–C permit the die 14 to be held by a vacuum tool (not shown) during optical alignment of the die 14 and interconnect 16. In a similar manner, a vacuum tool (not shown) can be used to disassemble the carrier 10. Alignment of the die 14 and interconnect 16 can be effected using flip chip optical alignment as disclosed in U.S. patent application Ser. No. 08/398,309 and U.S. Pat. No. 5,483,174, incorporated herein by reference.

The assembled carrier base 12 is designed to be placed in a burn-in oven (not shown) or other test apparatus for testing the die 14. The burn-in oven typically includes a supporting substrate having pogo pins or other electrical connectors for making an electrical connection between the output contacts 30 on the carrier 10 and external test circuitry.

As shown in FIGS. 1 and 2, the slide connector members 32, 34 are adapted to removably attach to the carrier base 12, one on each side. During attachment of the slide connector members 32, 34 to the base 12, the upper tine contacts 38U can slide over the contact pads 40 on the interconnect 16 and the lower tine contacts 38L can slide over the contact pads 42 on the base 12. This arrangement permits the electrical connection between the interconnect 16 and the base 12 to be established while permitting the interconnect 16 to be easily changed to accommodate testing of different dice 14.

Figure 7:
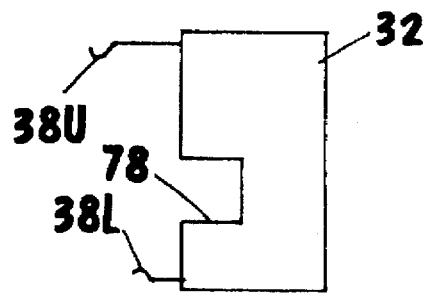
FIG. 7 is a side elevation view of a slide connector member constructed in accordance with the invention.

As shown in FIGS. 2 and 7, the upper tine contacts 38U on the connector members 32, 34 are thin metal wires made with a size and pitch that corresponds to the size and pitch of the contact pads 40 on the interconnect 16. In addition, the upper tine contacts 38U are bent or formed with a u-shaped segment on a terminal end for pressing against the contact pads 40. The spring force generated by the upper tine contacts 38U insures a positive electrical connection with the contact pads 40. In addition, the size and shape of the upper tine contacts 38U permit them to be slid over the edges of the interconnect 16 during attachment of the slide connector members 32, 34 to the base 12. The lower tine contacts 38L are made in a similar shape and function in a similar manner to the upper tine contacts 38U. The size and pitch of the lower tine contacts 38L corresponds to the size and pitch of the contact pads 42 for the external contacts 30.

As shown in FIG. 2, internal conductive lines 39 formed within the slide connector members 32, 34 electrically connect mating pairs of upper and lower tine contacts 38U and 38L. A fabrication process for fabricating the slide connector members 32, 34 with internal conductive lines 39 can combine electroless and electrolytic metal plating, photolithographic patterning and wet chemical etching. This fabrication technique for electronic components is sometimes referred to as molded 3-D fabrication because the molded components can include metal filled vias for interconnecting the circuitry in a z direction. Such a process is described in U.S. Pat. No. 4,985,116.

Using such a fabrication process, the connector members 32, 34 can be injection molded out of a high temperature plastic such as a glass filled plastic. Suitable plastics include polyetherimide (PEI), polyethersulfone (PES), polyarylsulfone (PAS), polyphenylene sulfide (PPS), liquid crystal polymer (LCP) and polyether-ether ketone (PPEK). The injection molding process forms the connector members 32, 34 into the desired shape and with a groove 78 (FIG. 7) sized to snap fit over the side rails 36 (FIG. 2) formed on the carrier base. In addition, openings or vias are molded into the slide connector members 32, 34 and during a subsequent metallization process are filled with a conductive metal to form the internal conductive lines 39. The upper and lower tine contacts 38U and 38L are formed as thin metal wires that are mechanically attached to the internal conductive lines 39 using an attachment process such as soldering or welding. The connector members 32, 34 can also be injection molded with solid metal wires that form the upper and lower tine contacts 38U and 38L. Advantageously, the size and pitch of the tine contacts 38U and 38L can be very small to accommodate a large number of output contacts 30 corresponding a large number of device bond pads 46 (FIG. 5).

FIG. 2A illustrates an alternate embodiment connector member 32A. Connector member 32A includes tine contacts 38A that make an electrical connection to both the interconnect 16 and base 12A. In this embodiment, the base 12A is formed with contact pads 42A on an upper surface that are electrically connected to internal conductive lines 39A and to the output contacts 30A for the base 12B. In this embodiment the tine contacts 38A are thin metal wires shaped with a double bend, substantially as shown in FIG. 2A, to simultaneously engage the contact pads 40 on the interconnect 16 and the contact pads 38A on the base 12A.

As with the slide connector members 32, 34, the carrier base 12 can be formed of an electrically insulating material such as ceramic or plastic. For example, the carrier base 12 can be formed of a ceramic material such as alumina ($Al_2O_3$) using a high temperature ceramic lamination process. Such a process is described in U.S. patent application Ser. No. 08/398,309 filed Mar. 1, 1995, which is incorporated herein by reference. Briefly, this process involves forming metallized circuits and metal filled vias on green sheets of ceramic and then sintering the sheets to form a unitary structure.

The carrier base 12 can also be formed using a 3-D injection molding process out of a high temperature glass filled plastic as previously described for slide connector members 32, 34. Such a 3-D molding process can be used to form the base 12 into the desired rectangular shape and with cavities as required. During a subsequent metallization process, the external contacts 30, contact pads 42 and conductors 52 (FIG. 6) can be formed on a bottom surface of the base 12.

The carrier base 12 can also be formed using a ceramic dip formation process (Cerdip). In general, with a Cerdip process a mixture of alumina lubricants and binders can be molded and sintered to form a monolithic structure. Another type of ceramic dip formation process uses a plastic rather than a ceramic body. Briefly, this Cerdip formation process pre-molds a plastic base which is then bonded to a lead-frame.

Referring to FIG. 4, the interconnect 16 includes the contact pads 40 and the raised contact members 44 that are electrically connected by a pattern of conductive traces 58. As shown in FIG. 5, the raised contact members 44 are adapted to establish an electrical connection with the device bond pads 46 on the die 12. The raised contact members 44 include penetrating projections 70 formed as elongated blades adapted to penetrate the device bond pads 46 to a limited penetration depth.

The interconnect 16 and raised contact members 44 can be formed by etching a silicon substrate 64 (FIG. 5). An insulating layer 66 and a conductive layer 68 formed on the substrate 64 overlie the raised contact members 44. The conductive layer 68 is in electrical communication with the conductive traces 58.

A suitable process for forming the contact members 44 substantially as shown in FIG. 5 is disclosed in U.S. Pat. Nos. 5,326,428 and 5,419,807 which are incorporated herein by reference. Another suitable process is disclosed in U.S. patent application Ser. No. 08/335,267 filed Nov. 7, 1994, U.S. Pat. No. 5,424,652, incorporated herein by reference.

Figure 5A:
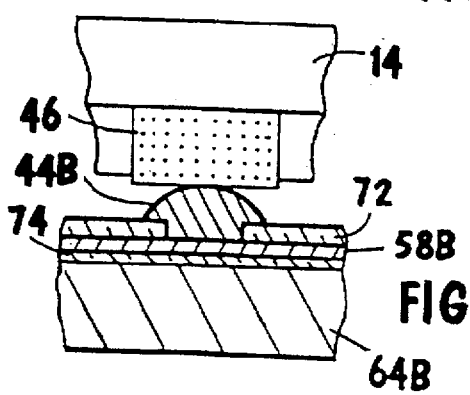
FIG. 5A is a cross sectional view equivalent to FIG. 5 of an alternate embodiment interconnect.

With reference to FIG. 5A, the interconnect 16 can also be formed with microbump contact members 44B and conductive traces 58B formed on a plastic film 72. The microbump contact members 44B and plastic film 72 can be similar to two layer TAB tape such as ASMAT manufactured by Nitto Denko. The plastic film 72 can be mounted to a substrate 64B such as silicon using a compliant adhesive layer 74. The compliant adhesive layer 74 can be formed of a silicone elastomer, an epoxy or a polyimide material. One method for forming an interconnect with microbump contact members is described in previously cited U.S. patent application Ser. No. 08/398,309, now U.S. Pat. No. 5,519,332.

Referring to FIG. 6, the external contacts 30 and contact pads 42 on the carrier base 12 can be formed as flat land pads in a dense grid pattern out of a suitable metal or stack of metals. Exemplary metals can include gold, copper, silver, tungsten, tantalum, platinum, palladium and molybdenum or alloys of these metals. An exemplary stack can include a gold layer with nickel underplating. Other exemplary stacks can include other combinations of the above metals. A metallization process such as plating can be used to form the external contacts 30, contact pads 42 and the pattern of conductors 52 on a bottom surface of the carrier base 12. Such a plating process can include electrolytic or electroless deposition of a metal layer followed by resist coating, exposure, development, and selective wet chemical etching. Typically, the exposed surface of the external contacts 30 and contact pads 42 will be an electroplated metal such as gold.

By way of example, a diameter of the external contacts 30 and contact pads 42 can be from about 50 µm to 500 µm. A center line to center line spacing of the external contacts 30 and contact pads 42 can be from about 50 µm to 500 µm. A representative thickness for the external contacts 30 and contact pads 42 can be from 1.25 µm to 100 µm. The external contacts 30 on the carrier base 12 are adapted to be contacted by a mating electrical connector on a burn-in board such as a pogo pin, solder ball, or other connector in electrical communication with external test circuitry. The contact pads 42 on the carrier base 12 are adapted to be contacted by the lower tine contacts 38L (FIG. 2).

While the invention has been described with reference to certain preferred embodiments, as will be apparent to those skilled in the art, certain changes and modifications can be made without departing from the scope of the invention as defined by the following claims.

What is claimed is:

1. An apparatus for testing unpackaged semiconductor dice comprising:
    a base for retaining a semiconductor die;
    an array of external contacts formed on the base, said external contacts in electrical communication with a first set of contact pads on the base;
    an interconnect mountable to the base, said interconnect including contact members for electrically contacting contact locations on the die, said contact members in electrical communication with a second set of contact pads on the interconnect;
    a connector member attachable to the base said connector member comprising a plurality of tine contacts, each of said tine contacts including a first portion for electrically contacting a contact pad of the first set, and a second portion for electrically contacting a contact pad of the second set; and
    a second interconnect interchangeable with the interconnect for electrically contacting a second semiconductor die retained on the base.

2. The apparatus as claimed in claim 1 wherein the connector member comprises molded plastic and the tine contacts comprise metal wires embedded in the plastic.

3. The apparatus as claimed in claim 1 wherein the base includes a rail and the connector member includes a groove configured for mating engagement with the rail.

4. The apparatus as claimed in claim 1 wherein the first portion and the second portion of each tine contact comprise spring segments.

5. The apparatus as claimed in claim 1 wherein the array of external contacts comprises a dense grid array.

6. An apparatus for testing unpackaged semiconductor dice comprising:
    a base;
    an array of external contacts formed on the base in electrical communication with a pattern of contact pads on the base;

a first interconnect mountable to the base, said first interconnect comprising first contact members configured to electrically engage contact locations on a first die held on the base, said first interconnect further comprising a first set of contact pads in electrical communication with the first contact members;

a second interconnect mountable to the base, said second interconnect comprising second contact members configured to electrically engage second contact locations on a second die held on the base, said second interconnect further comprising a second set of contact pads in electrical communication with the second contact members;

a connector member attachable to the base, said connector member including a plurality of tine contacts configured to electrically contact the pattern of contact pads on the base, and to electrically contact the first set of contact pads on the first interconnect for testing the first die, or the second set of contact pads on the second interconnect for testing the second die.

7. The apparatus as claimed in claim 6 wherein the base includes a rail and the connector member includes a molded body with a groove configured for mating engagement with the rail.

8. The apparatus as claimed in claim 6 wherein the connector member includes a molded body with internal traces in electrical communication with the tine contacts.

9. The apparatus as claimed in claim 6 wherein the tine contacts include spring segments configured to slide over the first and second sets of contact pads.

10. The apparatus as claimed in claim 6 wherein the connector member comprises a molded plastic body formed using a 3-D injecting molding process.

11. An apparatus for testing unpackaged semiconductor dice comprising:

a base;

an array of external contacts formed on a surface of the base, said external contacts in electrical communication with a pattern of contact pads on the base;

a first interconnect configured to mount to the base, said first interconnect comprising first contact members configured to electrically engage first contact locations on a first die retained on the base, said first contact members in electrical communication with a first pattern of contact pads on the interconnect;

a second interconnect configured to mount to the base, said second interconnect comprising second contact members configured to electrically engage second contact locations on a second die retained on the base, said second contact members in electrical communication with a second pattern of contact pads on the interconnect; and a connector member for physically attaching the first or second interconnect to the base, said connector member comprising a molded plastic body attachable to the base, said connector member further comprising metal wires embedded within the molded plastic body, said metal wires configured to contact the pattern of contact pads on the base, and to contact the first pattern of contact pads on the first interconnect for testing the first die, or the second pattern of contact pads on the second interconnect for testing the second die.

12. The apparatus as claimed in claim 11 wherein the base includes a rail and the connector member includes a groove configured for mating engagement with the rail.

13. The apparatus as claimed in claim 11 wherein the array of external contact comprises a dense grid array.

14. The apparatus as claimed in claim 11 wherein the connector member is formed using a 3-D molding process.

* * * * *

UNITED STATES PATENT AND TRADEMARK OFFICE
CERTIFICATE OF CORRECTION

PATENT NO. : 5,691,649
DATED : Nov. 25, 1997
INVENTOR(S) : Warren M. Farnworth, Salman Akram, Mike Brooks It is certified that error appears in the above-indentified patent and that said Letters Patent is hereby corrected as shown below:

Title page item [22], should read

--[22] Filed: Jan. 12, 1996 --.

Signed and Sealed this

Fifteenth Day of August, 2000

Attest:

Q. TODD DICKINSON

*Attesting Officer*        *Director of Patents and Trademarks*